(12) United States Patent
Kwon et al.

(10) Patent No.: US 7,319,711 B2
(45) Date of Patent: Jan. 15, 2008

(54) LIGHT-EMITTING DEVICE AND LIGHT-EMITTING DEVICE ARRAY USING A WHISPERING GALLERY MODE, AND METHOD FOR MANUFACTURING SAME

(75) Inventors: O'Dae Kwon, Kyungsangbuk-do (KR); Moojin Kim, Kyungsangbuk-do (KR); Sung Jae An, Kyungsangbuk-do (KR); Seungeun Lee, Kyungsangbuk-do (KR); Dongkwon Kim, Seoul (KR)

(73) Assignees: Postech Foundation, Kyungsangbuk-Do (KR); Postech Academy-Foundation Foundation, Kyungsangbuk-Do (KR)

(*) Notice: Subject to any disclaimer, the term of this patent is extended or adjusted under 35 U.S.C. 154(b) by 72 days.

(21) Appl. No.: 11/250,344

(22) Filed: Oct. 17, 2005

(65) Prior Publication Data

US 2007/0090338 A1    Apr. 26, 2007

(51) Int. Cl.
    *H01S 3/08*    (2006.01)
(52) U.S. Cl. .................................................... 372/92
(58) Field of Classification Search ........... 372/50.1, 372/50.11–50.23
    See application file for complete search history.

(56) References Cited

U.S. PATENT DOCUMENTS

| | | | | |
|---|---|---|---|---|
| 6,977,950 | B1 * | 12/2005 | Krishnamoorthy | 372/38.04 |
| 2002/0024980 | A1 * | 2/2002 | Kwon et al. | 372/45 |
| 2002/0126720 | A1 * | 9/2002 | Yang | 372/45 |
| 2004/0091010 | A1 * | 5/2004 | Choquette et al. | 372/44 |

OTHER PUBLICATIONS

David D. Smith et. al.; *Whispering-gallery mode splitting in coupled microresonators*; Sep. 2003; J. Opt. Soc. Am., vol. 20, No. 9, pp. 1967-1968.
B. H. Park et. al.; *Chiral wave propagation manifold of the photonic quantum-ring laser*; Jul. 22, 2002, Applied Physics Letters, vol. 81, No. 4, pp. 580-582.
Jun-Youn Kim et. al.; *Fabrication of photonic quantum ring laser using chemically assisted ion beam etching*; 2001; J. Vac. Sci. Technol., vol. 19, No. 4, pp. 1334-1338.
M. F. Crommle et. al.; *Imaging standing waves in a two-dimensional electron gas*; Jun. 10, 1993, Nature, vol. 363, pp. 524-527.
J. C. Ahn et. al.; *Photonic Quantum Ring*; Jan. 18, 1999; Physical Review Letters, vol. 82, No. 3, pp. 536-539.
Y. Hasegawa et. al.; *Direct Observation of Standing Wave Formation at Surface Steps Using Scanning Tunneling Spectroscopy*; Aug. 16, 1993, Physical Review Letters, vol. 71, No. 7, pp. 1071-1074.
C. Chicanne et. al.; *Imaging the Local Density of States of Optical Corrals*; Mar. 4, 2002; Physical Review Letters, vol. 88, No. 9, 4 pp.
S. L. McCall et. al.; *Whispering-gallery mode microdisk lasers*; Jan. 20, 1992, Appl. Phys. Lett 60, pp. 289-291.

* cited by examiner

*Primary Examiner*—Minsun Oh Harvey
*Assistant Examiner*—Xinning Niu
(74) *Attorney, Agent, or Firm*—Bacon & Thomas, PLLC

(57) ABSTRACT

A light-emitting device is capable of oscillating in a convex-whispering gallery mode. The lighting-emitting device includes a PIN-type semiconductor including a p-type distributed Bragg reflector, an active region and an n-type distributed Bragg reflector formed on a substrate by an epitaxial growth, wherein the PIN-type semiconductor having a hole with a predetermined diameter formed thereon, and an electrode connected to a region around the hole for applying a current to the hole. Further disclosed are a method for manufacturing the light-emitting device and an array of light-emitting devices.

10 Claims, 6 Drawing Sheets

LIGHT-EMITTING DEVICE AND LIGHT-EMITTING DEVICE ARRAY USING A WHISPERING GALLERY MODE, AND METHOD FOR MANUFACTURING SAME

FIELD OF THE INVENTION

The present invention relates to a light-emitting device; and, more particularly, to a light-emitting device, an array of light-emitting devices using a convex-whispering gallery mode and a method for manufacturing same.

BACKGROUND OF THE INVENTION

In general, the discovery of "whispering gallery (WG)" effect by Lord Rayleigh (see, 'philosophical magazine', vol. XX. pp. 1001-1004, 1910) has led to active researches upon the amplification of sound waves, microwaves, and light waves. Among the various researches, a thumbtack-type WG laser developed by Bell Laboratories has attracted considerable attention (see, "Whispering gallery mode micro-disk lasers", A, F, J, Levi, R. E. Slusher et al, Appl. Phys. Lett. 60.289, 1992). However, the thumbtack-type WG laser is two-dimensional, and it exhibits such a drawback of poor durability and accompanies several problems such as an output coupling and electro-pumping, which result in a difficulty of the manufacture thereof.

In order to solve the problems, a photonic quantum ring (PQR) laser has been proposed by Applicants (see, J. C. Ahn et al., "Photonic Quantum Ring", Phys. Rev. Lett. Vol. 82(3), pp. 536-539, January 1999; and U.S. Pat. No. 6,519,271 B2 and its counterpart Japanese Patent No. 3,333,747, which is commonly assigned to one of applicants, POSTECH foundation and is incorporated herein by reference.

The PQR laser has a configuration of three-dimensional cylindrical mesa similar to that of a vertical cavity surface emitting laser (VCSEL) of an electrical pumping type, and oscillates in a WG mode, thus effectively solving the problems of the poor device durability and the output coupling. Based on the hypothesis of a photonic quantum corral effect (PQCE) (analogous to the following: Y. Hasegawa and Ph. Avouris, "Direct observation of standing wave formation at surface steps using scanning tunneling spectroscopy", Phys. Rev. Lett. 71, pp. 1071, 1993; M. F. Crommie et al, "Imaging standing waves in a Two-dimensional electron gas", Nature, 363, pp. 524, 1993; C. Chicanne et al, "Imaging the local density of states of optical corrals", Phys. Rev. Lett. 88, pp. 97402, 2002), characteristics of threshold current of the PQR laser ranging from nA to µA can be explained (B. H. Park et al, "Chiral wave propagation manifold of the photonic quantum ring laser", Appl. Phys. Lett. Vol. 81, pp. 580-582, July 2002, E. Gehrig et al, "Dynamic filamentation and beam quality of quantum-dot lasers", Appl. Phys. Lett. 84, pp. 1650, 2004).

The thumbtack-type 2D-WG laser and the cylindrical mesa structured 3D-WG PQR laser are all based on the total reflection generated inside a resonator having concave surfaces, as described in the principle of Rayleigh's concavity which has been employed since 1912.

Further, a flatness process is additionally needed to fabricate the thumbtack-type 2D-WG laser and the cylindrical mesa structured 3D-WG PQR laser by using a polyimide in order to endow them the electro-pumping capability.

SUMMARY OF THE INVENTION

It is a primary object of the present invention to provide a light-emitting device capable of a whispering gallery mode emission without complying with Reyleigh's concavity principle.

It is another object of the present invention to provide a method for manufacturing a light-emitting device and an array of high-integration light-emitting devices by using a convex-whispering gallery mode, without having to perform a subsequent process such as a polyimide.

This light-emitting device is implemented by using a principle that light emission can be realized with semiconductor wafer with an active region around its middle area simply by forming a hole in the semiconductor wafer and then introducing current there into. At this time, light emission is realized around the hole by inducing a convex-whispering gallery resonance partly by gain guiding.

In accordance with a first aspect of the present invention, there is provided a light-emitting device using a convex-whispering gallery mode comprising:

a PIN-type semiconductor including a p-type distributed Bragg reflector, an active region and an n-type distributed Bragg reflector formed on a substrate by epitaxial growth, wherein the PIN-type semiconductor having a hole with a predetermined diameter formed in the PIN-type semiconductor; and an electrode connected to a region around the hole for applying current thereto.

In accordance with a second aspect of the present invention, there is provided a method for manufacturing a light-emitting device using a convex-whispering gallery mode, which comprises the steps of:

epitaxially growing a p-type distributed Bragg reflector, an active region and an n-type distributed Bragg reflector on a substrate, to thereby form a PIN-type semiconductor; etching the PIN-type semiconductor at least up to the active region to form a hole having a predetermined diameter; and connecting an electrode to a region around the hole for supplying current thereto.

In accordance with a third aspect of the present invention, there is provided a light-emitting device array using a convex-whispering gallery mode comprising:

a plurality of light-emitting devices, each light-emitting device includes: a PIN-type semiconductor including an active region having a plurality of quantum wells, and a p-type distributed Bragg reflector and an n-type distributed Bragg reflector with an active region sandwiched therebetween, wherein the PIN-type semiconductor has one or more holes, each hole being etched at least up to the active region; and an electrode connected to a region around the hole for applying current thereto.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
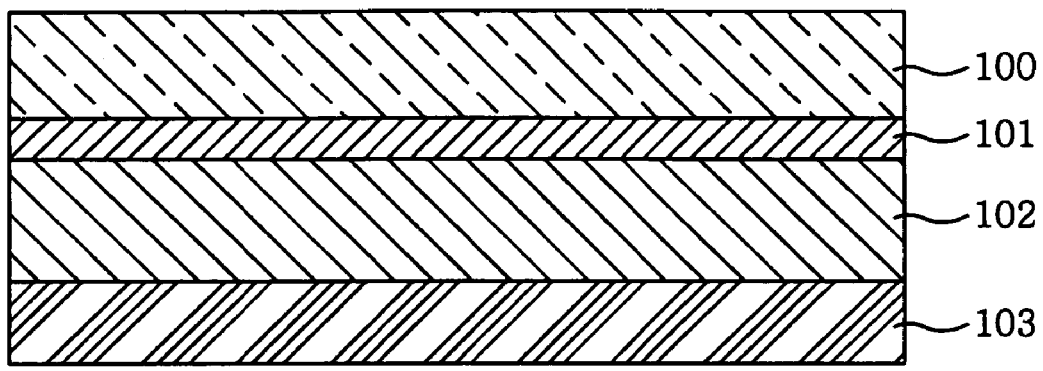
FIGS. 1A to 1D describe a manufacturing process of a light-emitting device using a convex-gallery whispering mode in accordance with a preferred embodiment of the present invention.

Hereinafter, a light-emitting device, an array of light-emitting devices and a method for manufacturing same will be described in accordance with preferred embodiments of the present invention with reference to the accompanying drawings. In this connection, like reference numerals represent like components in various drawings.

First of all, in order to assist easy understanding of the present invention, with regard to the term "convex-whispering gallery mode", a background technology related to a photonic quantum ring (PQR) laser will be explained as follows.

The PQR laser has a similar structure to that of a vertical cavity surface emitting laser (VCSEL), however, it shows a threshold current, at which the PQR laser starts to oscillate, ranging from μA to nA considerably lower than that of the VCSEL. This is because carriers in a quantum well (QW) state around the circumference of a QW micro-disk of an active region having a Rayleigh band forms a PQR through an instantaneous phase transition into a quantum wire (QWR) state.

The CAIBE technology enables etching a hole-shaped reverse mesa structure having a diameter of several μm as well as etching a mesa structure having a diameter of several tens of nm. With the reverse mesa structure, it is possible to attain an anti-whispering gallery mode which is contrary to an existing concave whispering gallery (WG) theory regarding the confinement of photons in a medium having a high refractive index. The anti-whispering gallery mode will now be referred to as a convex-whispering gallery mode in this specification.

On the other hand, in order for permitting the emission of the convex-whispering gallery mode within the hole-shaped reverse mesa structure, a resonance structure is required. An epitaxial structure of an existing PQR can be such a resonance structure. The PQR laser diode has the epitaxial structure obtained by epitaxial growing an active region with a plurality of quantum wells sandwiched between an n-type distributed Bragg reflector and a p-type Bragg reflector on a semiconductor substrate. The active region is formed of $Al_xGa_{1-x}As$ layers having relatively low band-gap energy and $Al_xGa_{1-x}As$ layers having relatively high band-gap energy alternately stacked on top of another. For example, a material of $Al_{0.3}Ga_{0.7}As$ is preferable for the layers having relatively low band-gap energy and a material of $Al_{0.0}Ga_{1.0}As$ is preferable for the layers having relatively high band-gap energy. Further, it is also possible to constitute the active region with Al whose content ranges from 0 to 1.0. In addition, the number and the shape of the quantum wells may be selected appropriately depending on necessity. The detailed structure of the PQR laser is described in U.S. Pat. No. 6,519,271 B2, entitled "PHOTONIC QUANTUM RING LASER DIODE". Referring now to FIGS. 1A to 1D, there is illustrated a manufacturing process of a light-emitting device using a convex-whispering gallery mode in accordance with a preferred embodiment of the present invention.

As shown in FIG. 1A, an n-type distributed Bragg reflector (an n-DBR) 102, an active region 101, a p-type distributed Bragg reflector (a p-DBR) 100 are formed on a substrate 103 using an epitaxial growth technique, to thereby form a PIN type semiconductor wafer in which the active region 101 is disposed between the n-DBR 102 and the p-DBR 100.

Further details to the description of the p-DBR 100, the active region 101 and the n-DBR 102 are fully disclosed in U.S. Pat. No. 6,519,271 B2 as described above, which is fully incorporated herein by reference.

Figure 1B:
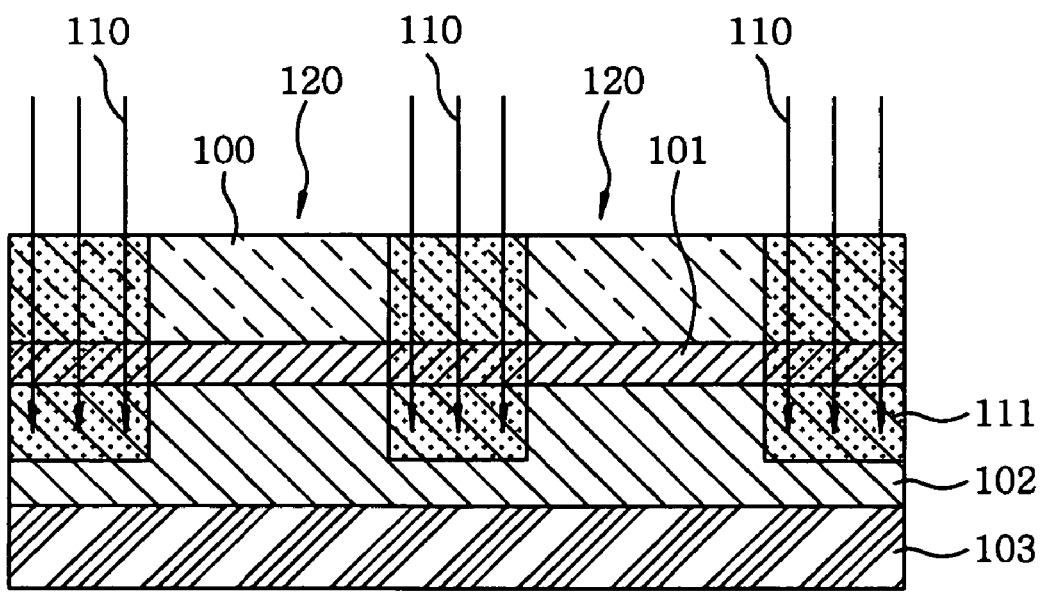

Then, as shown in FIG. 1B, a process is performed to vertically implant ions, e.g., $H^+$ions 110 into the PIN type semiconductor while leaving a region to be formed a hole at regular intervals. Sequentially, the PIN type semiconductor has an ion-implanted region 111 and a remainder region, i.e., a non-implanted region or a hole region 120 except the ion-implanted region 111. As will be disclosed later, the ion-implanted region 111 serves to insulate between the holes.

Figure 1C:
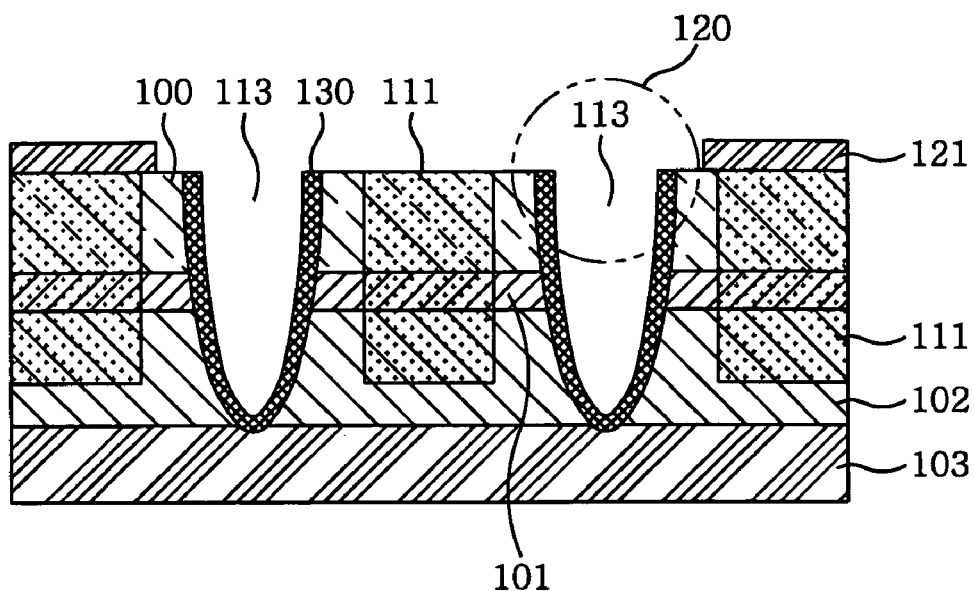

After the implantation of the $H^+$ions 110, each non-implanted region 113 in the PIN type semiconductor is etched using a CAIBE technology to form holes 113, as shown in FIG. 1C. Herein, a reference numeral 130 represents a passivation film treated with sulfur and then coated with silicon nitride $(SiN_x)$ film inside each hole. Although it is shown in FIG. 1C that the holes are etched to reach the substrate 103, the depth of the holes is substantially adjusted precisely, as shown in FIG. 2, at least up to the active region 102.

Figure 1D:
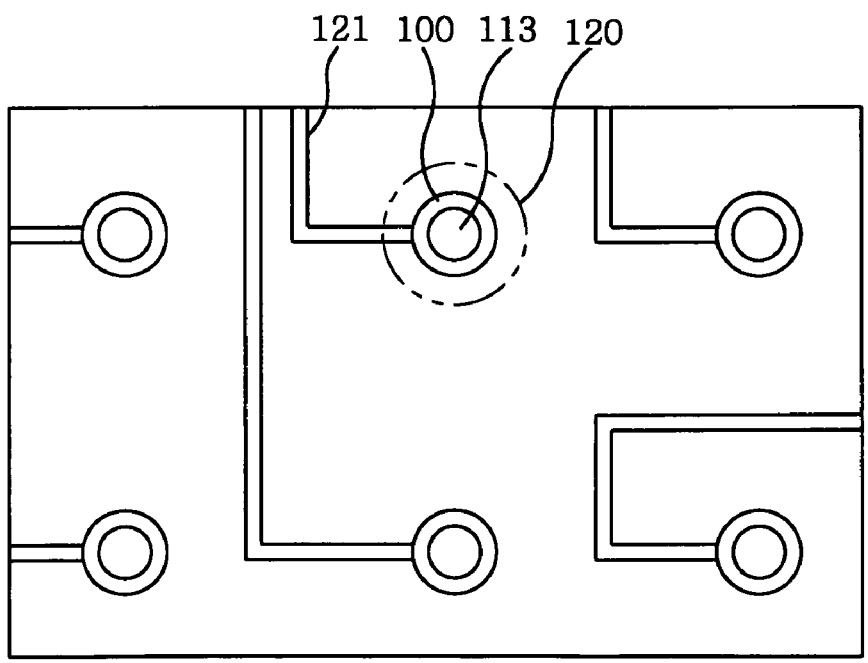

Subsequently, as shown in FIG. 1D, a line-shaped p-type electrode 121 is connected to around each hole 113 (i.e., the non-implanted region 120 having the hole 113) for applying current thereto, respectively, to thereby form a light-emitting device.

Figure 2:
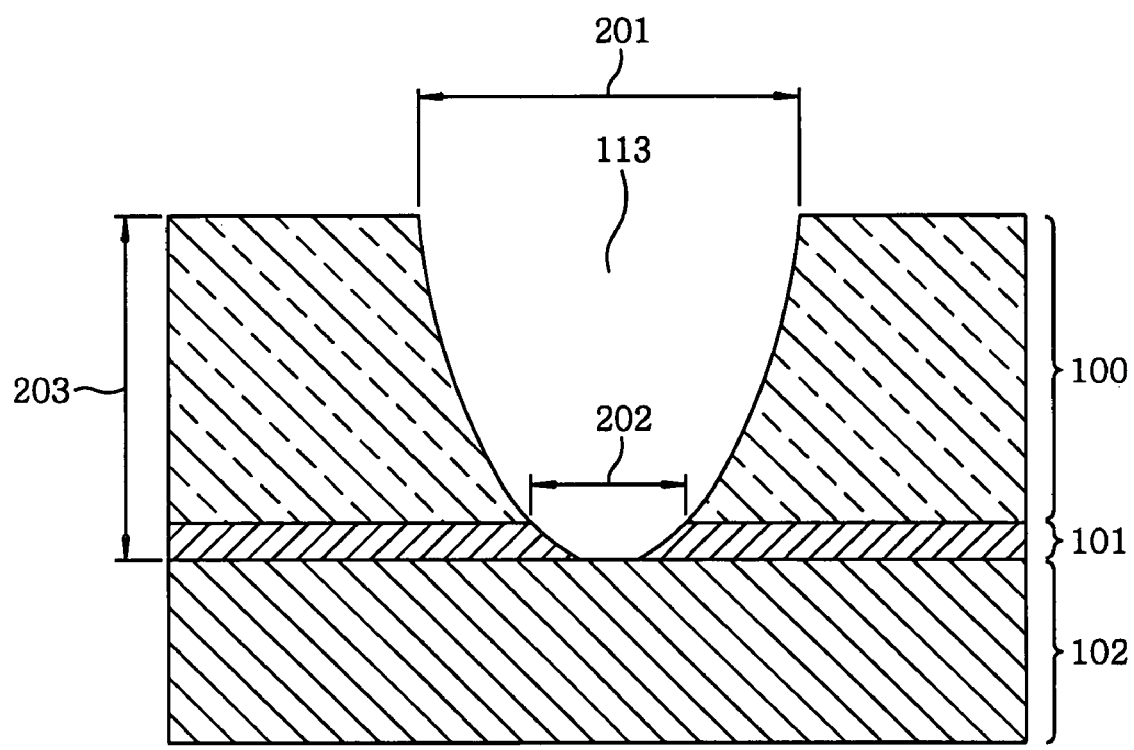
FIG. 2 shows a schematic view of a PIN type semiconductor having a hole formed therein by chemical assisted ion beam etching (CAIBE), which is taken by an electron microscope.

FIG. 2 illustrates a schematic view of a PIN type semiconductor having a hole formed therein by using a CAIBE, taken by an electron microscope.

Referring to FIG. 2, a hole 113 formed by etching has an upper diameter 201 of 3.56 μm, a lower diameter 202 of 1.43 μm, and a depth 203 of 3.4 μm, and thus, has a bowl shape that is narrowed from top to bottom. According to the present invention, it is preferable to make the diameter of the hole within several nm to several hundred μm, most preferably within 10 nm to 100 μm.

Figure 3A:
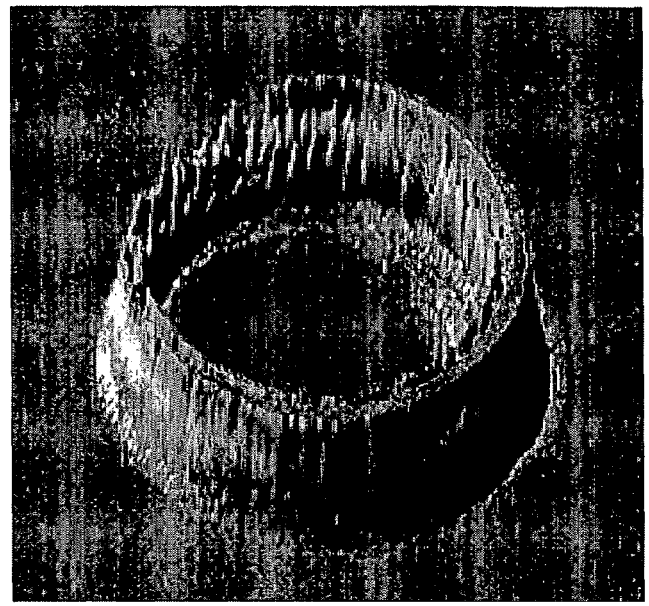
FIG. 3A illustrates the intensity of light emitted from a hole having a diameter of 6 μm when current of 4 mA is applied to around the hole.
Figure 3B:
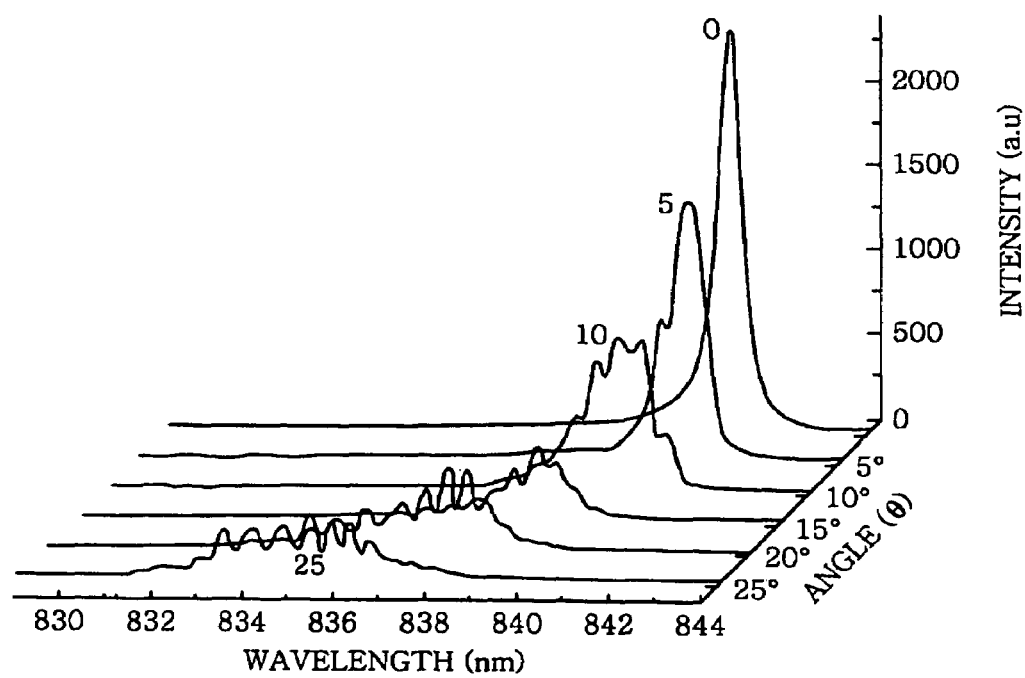
FIG. 3B shows a distribution of wavelengths of the light, emitted from a hole having a diameter of 6 μm, detected by varying a detection angle when current of 100 mA is applied to around the hole.

FIGS. 3A and 3B illustrate the intensity of light emitted from a hole having a diameter of 6 μm when current of 4 mA is applied to around the hole and a distribution of wavelengths of the light emitted from a hole having a diameter of 6 μm, detected by varying a detection angle when applying current of 100 mA, respectively. The intensity and the wavelengths of the light are measured with respect to a vertical line on an edge of the hole by using an optical spectrum analyzer such as "HP70004A", and the measurement method of which is disclosed in U.S. Patent Application Publication No. US2002/0024980 A1.

Therefore, it is known from FIG. 3A that light emission in the convex-whispering gallery mode is concentrated at the center of the hole. Further, as viewing angle (the viewing angle becomes zero when an upright line on an edge of the hole as shown in FIG. 2 is made vertical) is increased, separation phenomenon of light emission mode becomes distinct, and the wavelength is blue-shifted.

Figure 4:
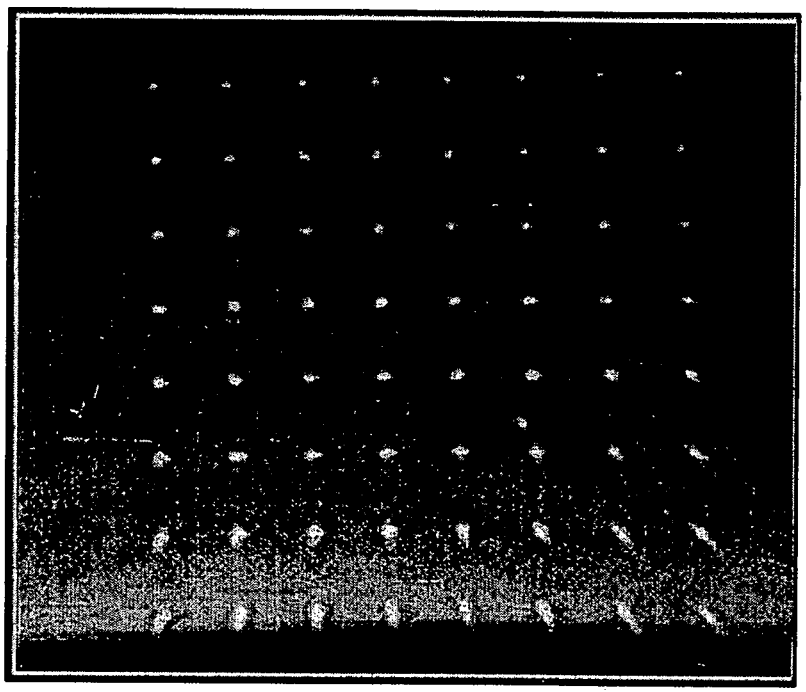
FIG. 4 is a top view of an array of 8×8 light-emitting devices taken by the microscope and charge-coupled device.

FIG. 4 is a top view of an array of 8×8 light-emitting devices, which is taken by an electron microscope and charged-coupled device. In the light-emitting device array in FIG. 4, each hole has a diameter of 15 µm, and the distance between neighboring holes is 100 µm.

Figure 5:
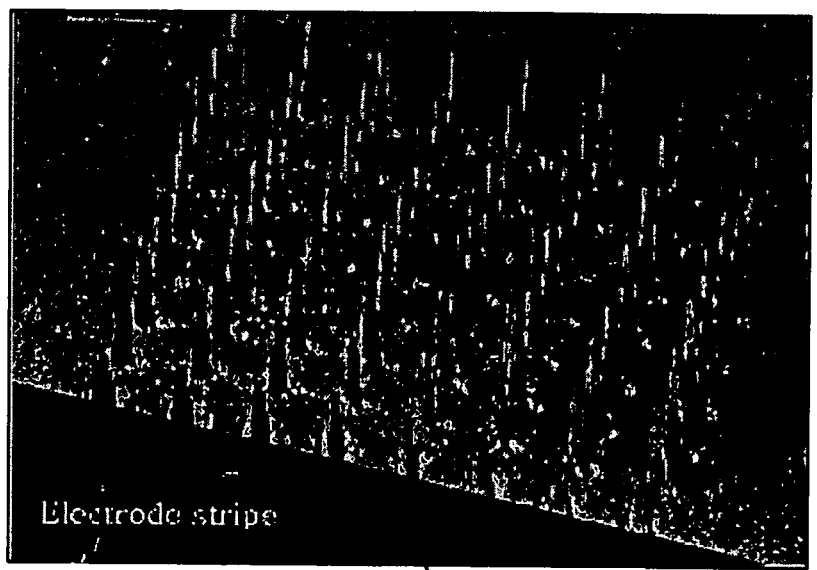
FIG. 5 describes a distribution of light intensity when a current of 15 mA is applied to the 8×8 light-emitting device array.

FIG. 5 illustrates a distribution of intensities of emitted light when a current of 15 mA is applied to the 8×8 light-emitting device array shown in FIG. 4. A reference numeral 500 on a lower left portion of the drawing indicates an electrode stripe representing a line-shaped p-type electrode.

Referring to FIG. 5, the total amount of the applied current is 15 mA, and the intensity of the emitted light is found to be uniform even though the electrode stripe is located aside from the center of the array.

As described above, in case of manufacturing the light-emitting device using the convex-whispering gallery mode, such subsequent processes for semiconductor as a polyimide process, a metallization process and the like are not necessary. Thus, this manufacturing method can be advantageously employed for the fabrication of a highly integrated array of light-emitting devices.

In the array of 8×8 light-emitting devices shown in FIG. 5, a whole area with distributed holes is $4.9\times10^5$ $\mu M^2$ (=700 µm×700 µm), and an effective area occupied by the holes is $1.1\times10^4$ $\mu m^2$ (=$\pi \times 7.5^2$ µm×64 µm). Assuming that the applied current is uniformly distributed over the whole area of the light-emitting device array and the light-emitting devices in the array are not insulated from each other without having to the ion implantation, an actual current that contributes to the light emission in the convex-whispering gallery mode is about 2.2% of the total amount of the applied current. Considering that almost the whole amount of the applied current contributes to light emission in case of a typical light emitting diode, this figure implies the importance of the ion implantation. Therefore, if unnecessary regions between the holes are insulated through the use of the ion implantation and carriers are implanted only in the holes, the efficiency of the applied current can be increased, and the manufacture of a oscillating laser can be enabled.

Figure 6:
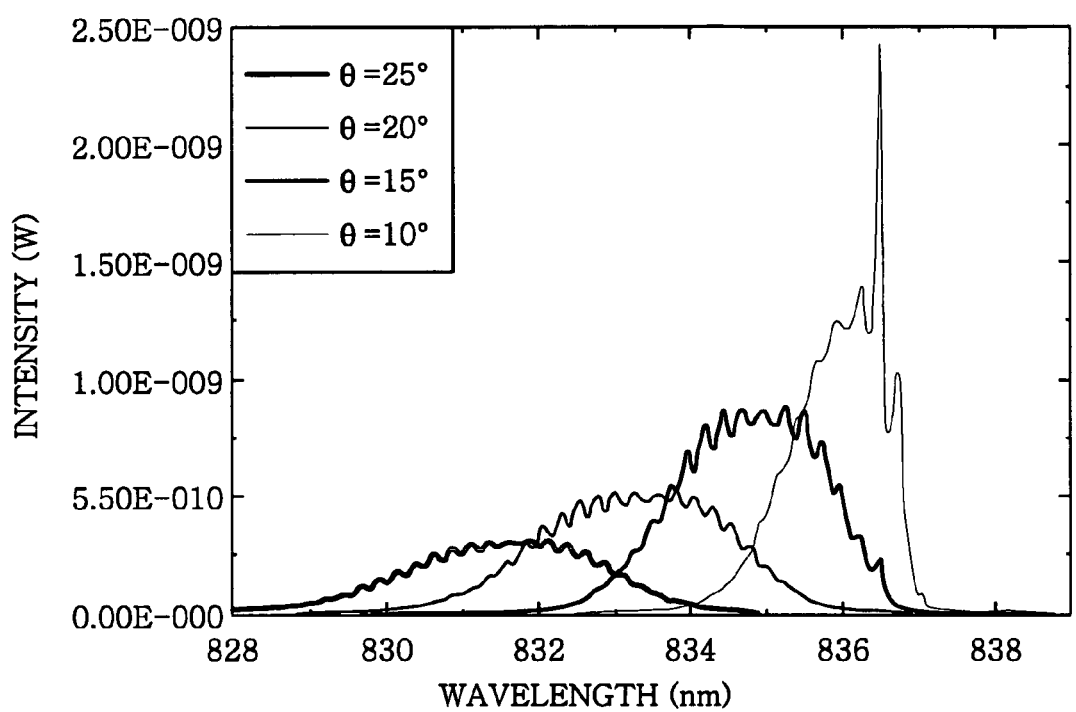
FIG. 6 sets forth a spectrum of a multi-wavelength operating mode obtained by varying an angle of a light-emitting device in which ions are implanted in a concentric circular shape with a diameter of 60 μm around a hole having a diameter of 27 μm.

FIG. 6 sets forth a spectrum of a multi-wavelength operating mode obtained by varying an angle of a light-emitting device in which an ion implantation is taken around a hole having a diameter of 27 µm in a concentric circular shape with a diameter of 60 nm. As shown in FIG. 6, unlike the spectrum in FIG. 7 obtained without performing an ion implantation, a conspicuous mode separation phenomenon can be attained at a relatively large angle, and internal current efficiency is improved.

Accordingly, it is possible to fabricate a light-emitting device without complying with Rayleigh's concavity principle that has been used since 1910. Further, by using the convex-whispering gallery mode, a subsequent process such as a polyimide process, a metallization process, and the like is not needed for the manufacture of a high-integration light-emitting device array.

While the invention has been shown and described with respect to the preferred embodiments, it will be understood by those skilled in the art that various changes and modifications may be made without departing from the spirit and scope of the invention as defined in the following claims.

What is claimed is:

1. A light-emitting device using a convex-whispering gallery mode comprising:
    a PIN-type semiconductor including a p-type distributed Bragg reflector, an active region and an n-type distributed Bragg reflector formed on a substrate by epitaxial growth, wherein the PIN-type semiconductor having a hole with a predetermined diameter formed in the PIN-type semiconductor; and
    an electrode connected to a region around the hole for applying current thereto,
    wherein light is emitted around the hole by inducing a convex-whispering gallery resonance partly by gain guiding.

2. The light-emitting device of claim 1, wherein the active region is formed by depositing first layers having a relatively high band-gap energy and second layers having a relatively low band-gap energy alternately, and wherein the first and the second layers include a plurality of quantum wells of $Al_xGa_{1-x}As$ layers.

3. The light-emitting device of claim 1, wherein the hole is etched up to the active region.

4. The light-emitting device of claim 3, wherein the diameter of the hole is 10 nm to 100 µm.

5. A light-emitting device array using a convex-whispering gallery mode comprising:
    a plurality of light-emitting devices, each light-emitting device includes:
    a PIN-type semiconductor including an active region having a plurality of quantum wells, and a p-type distributed Bragg reflector and an n-type distributed Bragg reflector with an active region sandwiched therebetween, wherein the PIN-type semiconductor has one or more holes, each of the holes being etched at least up to the active region; and
    an electrode connected to a region around said each of the holes for applying current thereto,
    wherein light is emitted around said each of the holes by inducing a convex-whispering gallery resonance partly by gain guiding.

6. The light-emitting device array of claim 5, wherein the diameter of the hole is 10 nm to 100 µm.

7. The light-emitting device array of claim 5, wherein the PIN semiconductor has an area made by an ion implantation except the region around said each of the holes in order to isolate between the holes.

8. The array of claim 5, wherein the active region is formed by depositing first layers having relatively high band-gap energy and second layers having relatively low band-gap energy alternately, and wherein the first and the second layers include $Al_xGa_{1-x}As$ layers.

9. The light-emitting device of claim 1, wherein the electrode is line-shaped.

10. The light-emitting device of claim 5, wherein the electrodes are line-shaped.

* * * * *